(12) United States Patent
Huang

(10) Patent No.: US 12,484,341 B2
(45) Date of Patent: Nov. 25, 2025

(54) METHOD FOR GROWING ELECTRON-BLOCKING LAYER, EPITAXIAL LAYER, AND LIGHT-EMITTING DIODE CHIP

(71) Applicant: CHONGQING KONKA PHOTOELECTRIC TECHNOLOGY RESEARCH INSTITUTE CO., LTD., Chongqing (CN)

(72) Inventor: ZhaoBin Huang, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 421 days.

(21) Appl. No.: 18/152,912

(22) Filed: Jan. 11, 2023

(65) Prior Publication Data
US 2023/0163241 A1    May 25, 2023

Related U.S. Application Data

(63) Continuation of application No. PCT/CN2021/130007, filed on Nov. 11, 2021.

(51) Int. Cl.
*H10H 20/825*  (2025.01)
*H10H 20/01*   (2025.01)
*H10H 20/816*  (2025.01)

(52) U.S. Cl.
CPC .... *H10H 20/8162* (2025.01); *H10H 20/0137* (2025.01); *H10H 20/825* (2025.01)

(58) Field of Classification Search
CPC .......... H10H 20/8162; H10H 20/825
See application file for complete search history.

(56) References Cited

U.S. PATENT DOCUMENTS

2011/0272667 A1  11/2011  Takayama
2015/0263228 A1*  9/2015  Lee ............... H10H 20/811
                                                257/76

FOREIGN PATENT DOCUMENTS

CN      104810447 A    7/2015
CN      105790072 A    7/2016
(Continued)

OTHER PUBLICATIONS

The International Search Report issued in corresponding International Application No. PCT/CN2021/130007, mailed Jun. 22, 2022.
(Continued)

*Primary Examiner* — Douglas M Menz
(74) *Attorney, Agent, or Firm* — HAUPTMAN HAM, LLP

(57) ABSTRACT

A method for growing an electron-blocking layer, an epitaxial layer, and an LED chip are provided in the present disclosure. The epitaxial layer includes an N-type semiconductor layer, an active layer, a P-type semiconductor layer, and an electron-blocking layer. The electron-blocking layer is disposed between the active layer and the P-type semiconductor layer, and the N-type semiconductor layer is disposed on one side of the active layer away from the electron-blocking layer. The electron-blocking layer includes a proximal aluminum barrier layer close to the active layer, a distal aluminum barrier layer close to the P-type semiconductor layer, and an indium well layer disposed between the proximal aluminum barrier layer and the distal aluminum barrier layer. The content of aluminum component in the distal aluminum barrier layer is lower than the content of aluminum component in the proximal aluminum barrier layer.

15 Claims, 14 Drawing Sheets

(56) References Cited

FOREIGN PATENT DOCUMENTS

| CN | 107195738 A | 9/2017 |
| CN | 108028300 A | 5/2018 |
| CN | 109786526 A | 5/2019 |
| CN | 109786529 A | 5/2019 |
| CN | 112382710 A | 2/2021 |
| KR | 20140101130 A | 8/2014 |
| KR | 20200002106 A | 1/2020 |

OTHER PUBLICATIONS

First Office Action issued in corresponding CN application No. 202111331438.4 dated Mar. 23, 2023.
Second Office Action issued in corresponding CN application No. 202111331438.4 dated Apr. 21, 2023.
Notification of grant of patent right for invention issued in corresponding CN application No. 202111331438.4 dated May 22, 2023.

* cited by examiner

METHOD FOR GROWING ELECTRON-BLOCKING LAYER, EPITAXIAL LAYER, AND LIGHT-EMITTING DIODE CHIP

CROSS-REFERENCE TO RELATED APPLICATIONS

This application is a continuation of International Application No. PCT/CN2021/130007, filed on Nov. 11, 2021, the entire disclosure of which is incorporated herein by reference.

TECHNICAL FIELD

This disclosure relates to the field of semiconductor technology, and in particular to a method for growing an electron-blocking layer, an epitaxial layer, and a light-emitting diode (LED) chip.

BACKGROUND

Group III-nitride based devices such as Gallium Nitride (GaN) based LED chips, have attracted much attention due to their high reliability, high cost performance, and high efficiency, and are widely used in various industries. With development of a production process of GaN-based LED chips, higher requirements are put forward in the industry on the luminescent efficiency of GaN-based LED chips, and how to improve the luminescent efficiency of LED chips is a problem to be solved urgently at present.

SUMMARY

An epitaxial layer is provided in the present disclose. The epitaxial layer includes an N-type semiconductor layer, an active layer, a p-type semiconductor layer, and an electron-blocking layer. The electron-blocking layer is disposed between the active layer and the P-type semiconductor layer, and the N-type semiconductor layer is disposed on one side of the active layer away from the electron-blocking layer. The electron-blocking layer includes a proximal aluminum barrier layer close to the active layer, a distal aluminum barrier layer close to the P-type semiconductor layer, and an indium well layer disposed between the proximal aluminum barrier layer and the distal aluminum barrier layer, where a content of aluminum component in the distal aluminum barrier layer is lower than a content of aluminum component in the proximal aluminum barrier layer.

Based on the same inventive concept, an LED chip is further provided in the present disclosure. The LED chip includes an N-type semiconductor layer, an active layer, a P-type semiconductor layer, an electron-blocking layer, an N-electrode electrically coupled with the N-type semiconductor layer, and a p-electrode electrically coupled with the p-type semiconductor layer. The electron-blocking layer is disposed between the active layer and the P-type semiconductor layer, and the N-type semiconductor layer is disposed on one side of the active layer away from the electron-blocking layer. The electron-blocking layer includes a proximal aluminum barrier layer close to the active layer, a distal aluminum barrier layer close to the P-type semiconductor layer, and an indium well layer disposed between the proximal aluminum barrier layer and the distal aluminum barrier layer, where a content of aluminum component in the distal aluminum barrier layer is lower than a content of aluminum component in the proximal aluminum barrier layer.

Based on the same inventive concept, a method for growing an electron-blocking layer is further provided in the present disclosure. The method includes the following. Grow a proximal aluminum barrier layer on a surface of an active layer away from an N-type semiconductor layer. Grow an indium well layer on the proximal aluminum barrier layer. Grow a distal aluminum barrier layer on the indium well layer, a content of aluminum component in the distal aluminum barrier layer being lower than a content of aluminum component in the proximal aluminum barrier layer.

DESCRIPTION OF REFERENCE SIGNS

Figure 1:
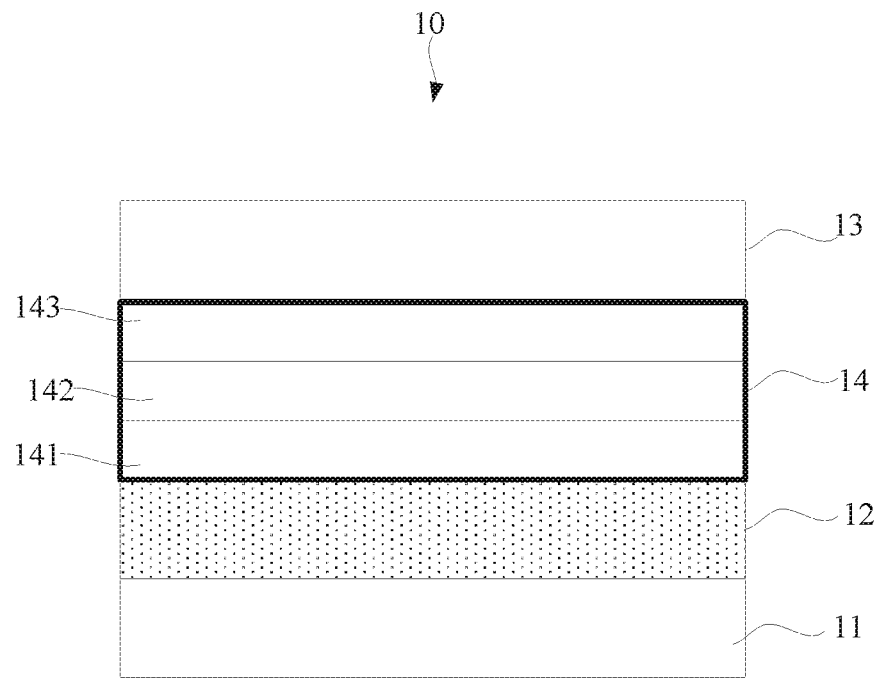
FIG. 1 is a structural schematic diagram of an epitaxial layer provided in an implementation of the present disclosure.

10—epitaxial layer; 11—N-type semiconductor layer; 12—active layer; 13—P-type semiconductor layer; 14—electron-blocking layer; 141—proximal aluminum barrier layer; 1411—first sub-layer; 1412—second sub-layer; 1413—third sub-layer; 142—indium well layer; 1421—fourth sub-layer; 1422—fifth sub-layer; 143—distal aluminum barrier layer; 1431—sixth sub-layer; 1432—seventh sub-layer; 8—LED chip; 81—N-electrode; 83—P-electrode; 90—epitaxial layer; 91—substrate; 92—buffer layer; 93—GaN intrinsic layer; 94—N-type GaN layer; 95—N-type retardation layer; 96—active layer; 97—electron-blocking layer; 971—proximal AlGaN layer; 9711—first sub-layer; 9712—second sub-layer; 9713—third sub-layer; 972—InGaN layer; 9721—fourth sub-layer; 9722—fifth sub-layer; 973—distal AlGaN layer; 9731—sixth sub-layer; 9732—seventh sub-layer; and 98—P-type GaN layer.

DETAILED DESCRIPTION

In order for those skilled in the art to better understand technical solutions of the disclosure, technical solutions of implementations will be described clearly and completely with reference to accompanying drawings in the implementations. Apparently, implementations described hereinafter are merely some implementations, rather than all implementations of the disclosure. All other implementations obtained by those of ordinary skill in the art based on the implementations without creative efforts shall fall within the protection scope of the disclosure.

In order to facilitate understanding of the present disclosure, the present disclosure will be described completely hereinafter with reference to accompanying drawings. Preferred implementations of the present disclosure are illustrated in the accompanying drawings, however, the present disclosure may be implemented in many different forms and is not limited to implementations described herein. Rather, implementations are provided to make the present disclosure thorough and complete.

Unless defined otherwise, all technical and scientific terms used herein have the same meaning as commonly understood by those of ordinary skill in the field to which the disclosure belongs. The terms used herein in the description of the present disclosure is for the purpose of describing specific implementations only and is not intended to limit the present disclosure.

An LED device is a semiconductor electronic device for converting electrical energy into light energy. When a current flows, electrons and holes recombine in an active layer to emit light. As a highly efficient, environmentally friendly, and green novel solid state light source, an LED has advantages of low voltage, low power consumption, small volume, light weight, long service life, high reliability, etc., and is rapidly and widely applied, especially in the field of lighting and display.

How to improve the luminescent efficiency of an LED chip has always been a research hotspot in the industry. On this basis, a solution capable of solving the described technical problem is to be provided in the present disclosure and will be described in detail in subsequent implementations.

An alternative implementation is provided in the present disclosure.

An epitaxial layer is first provided in the present disclosure and reference can be made to FIG. 1 which is a schematic structural diagram of an epitaxial layer. The epitaxial layer 10 includes an N-type semiconductor layer 11, an active layer 12, and a P-type semiconductor layer 13, and the active layer 12 is disposed between the N-type semiconductor layer 11 and the P-type semiconductor layer 13. The epitaxial layer 10 further includes an electron-blocking layer (EBL) 14, the electron-blocking layer 14 is disposed between the active layer 12 and the P-type semiconductor layer 13, and the electron-blocking layer 14 can block electrons escaping from the active layer 12 from entering the P-type semiconductor layer 13. It can be understood that the epitaxial layer 10 can further include one or more other layered structures, such as at least one of a buffer layer, an intrinsic layer, an ohmic contact layer, etc.

In this implementation, from one side of the electron-blocking layer 14 close to the active layer 12 to one side of the electron-blocking layer 14 close to the P-type semiconductor layer 13, the electron-blocking layer 14 includes a proximal aluminum barrier layer 141, an indium well layer 142, and a distal aluminum barrier layer 143 in sequence. Terms "proximal" and "distal" in expressions "proximal aluminum barrier layer" and "distal aluminum barrier layer" are defined according to distances of two layered structures relative to the active layer 12. The proximal aluminum barrier layer 141 is relatively close to the active layer 12, and the distal aluminum barrier layer 143 is relatively far away from the active layer 12. In this implementation, the indium well layer 142 serves as a channel layer, and forms a hole-injection pumping structure together with the proximal aluminum barrier layer 141 and the distal aluminum barrier layer 143, which can increase injection efficiency of holes in the P-type semiconductor layer 13 into the active layer 12, thereby increasing a probability of recombination of electrons and holes in the active layer 12.

Since a content of aluminum component in the distal aluminum barrier layer 143 is lower than a content of aluminum component in the proximal aluminum barrier layer 141, a potential barrier of the distal aluminum barrier layer 143 is lower than a potential barrier of the proximal aluminum barrier layer 141, which helps to reduce a forward voltage of an LED chip. In some implementations, the content of the aluminum component in the distal aluminum barrier layer 143 is 45% to 75% of the content of the aluminum component in the proximal aluminum barrier layer 141, such as 50% to 70%. In some examples, the content of the aluminum component in the distal aluminum barrier layer 143 is any one of 45%, 50%, 55%, 60%, or 75% of the content of the aluminum component in the proximal aluminum barrier layer 141. It can be understood by those skilled in the art a percentage of contents of the aluminum component in the distal aluminum barrier layer 143 and the proximal aluminum barrier layer 141 are not limited herein.

In some implementations, the proximal aluminum barrier layer 141 and the distal aluminum barrier layer 143 each contain Aluminum Gallium Nitride (AlGaN). In some implementations, the indium barrier layer 142 contains Indium Gallium Nitride (InGaN). It can be understood that the electron-blocking layer 14 may be a p-type doped layered structure, and the electron-blocking layer 14 may contain a p-type doped element, which may include but is not limited to Magnesium (Mg), Zinc (Zn), and the like.

Figure 2:
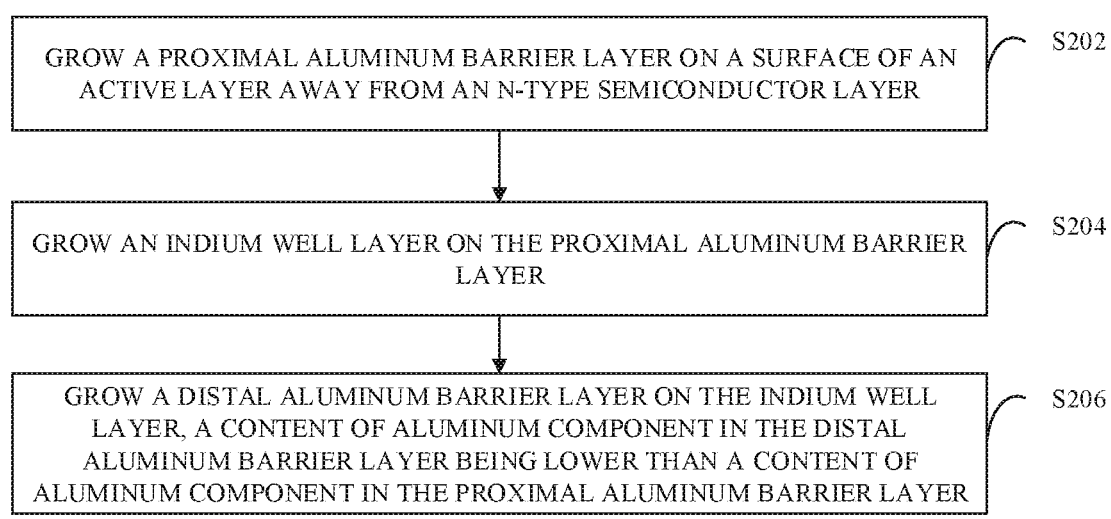
FIG. 2 is a schematic flowchart illustrating a method for growing an electron-blocking layer provided in an implementation of the present disclosure.
Figure 3:
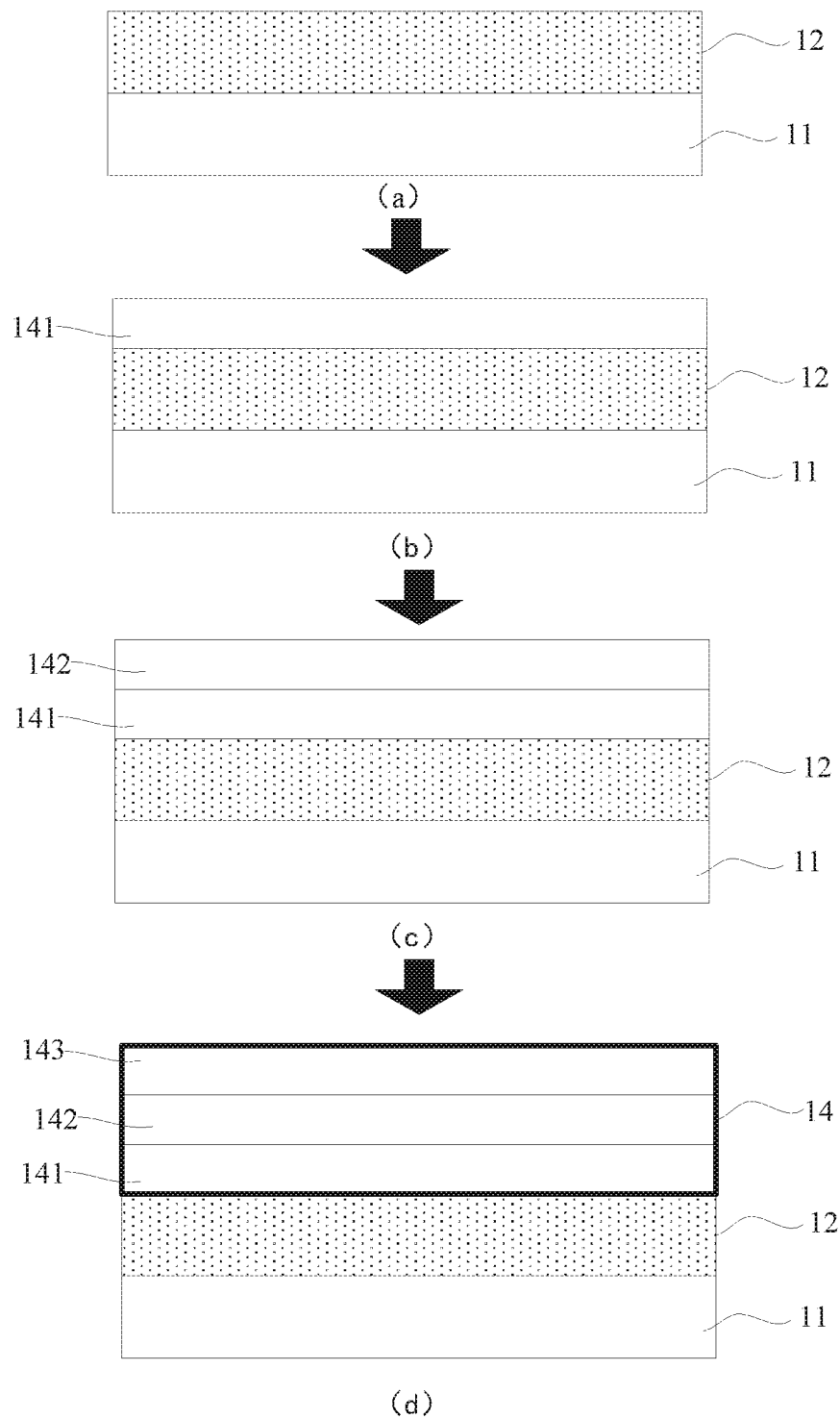
FIG. 3 is a schematic diagram illustrating a process for growing an electron-blocking layer provided in an implementation of the present disclosure.

A method for growing an electron-blocking layer 14 is further provided in the present disclosure and reference can be made to FIG. 2 and FIG. 3.

S202, grow a proximal aluminum barrier layer on a surface of an active layer away from an N-type semiconductor layer.

It can be understood that, the electron-blocking layer 14 is disposed between the active layer 12 and the P-type semiconductor layer 13, and in the process of growing the epitaxial layer 10, the electron-blocking layer 14 generally grows from the N-type semiconductor layer 11 to the P-type semiconductor layer 13, therefore the electron-blocking layer 14 should be epitaxially grown on the active layer 12 after the growth of the active layer 12. It can be understood that, an N-type semiconductor layer 11 is further grown under the active layer 12, and reference can be made to part (a) of FIG. 3, the proximal aluminum barrier layer 141 is grown on one side of the active layer 12 away from the N-type semiconductor layer 11, as illustrated in part (b) pf FIG. 3.

S204, grow an indium well layer on the proximal aluminum barrier layer.

After the proximal aluminum barrier layer 141 is grown, the indium well layer 142 is epitaxially grown on the proximal aluminum barrier layer 141, as illustrated in part (c) of FIG. 3.

S206, grow a distal aluminum barrier layer on the indium well layer, a content of aluminum component in the distal aluminum barrier layer being lower than a content of aluminum component in the proximal aluminum barrier layer.

After the indium well layer 142 is grown, the distal aluminum barrier layer 143 is grown on the indium well layer 142, as illustrated in part (d) of FIG. 3, In this implementation, a content of aluminum source introduced into an reaction chamber when the distal aluminum barrier layer 143 is grown is lower than a content of aluminum source introduced into the reaction chamber when the proximal aluminum barrier layer 141 is grown, In this way, it can be ensured that the content of the aluminum component in the grown distal aluminum barrier layer 143 is lower than the content of the aluminum component in the proximal aluminum barrier layer 141. In this way, it can be ensured that the potential barrier of the distal aluminum barrier layer 143 is lower than the potential barrier of the proximal aluminum barrier layer 141.

In some implementations, when the electron-blocking layer 14 is grown, growth with component varying in a gradient manner is adopted in at least one stage, and thus at least one of the content of the aluminum component in the proximal aluminum barrier layer 141, the content of the aluminum component in the distal aluminum barrier layer 143, or the content of the indium component in the indium well layer 142 varies in a gradient manner. For example, in the electron-blocking layer 14, only the content of the aluminum component in the proximal aluminum barrier layer 141 varies in a gradient manner, only the content of the aluminum component in the distal aluminum barrier layer 143 varies in a gradient manner, or only the content of the indium component in the indium well layer 142 varies in a gradient manner. In other implementations, the content of the aluminum component in the proximal aluminum barrier layer 141 and the content of the indium component in the indium well layer 142 vary in a gradient manner, or the content of the aluminum component in the proximal aluminum barrier layer 141 and the content of the aluminum component in the distal aluminum barrier layer 143 vary in a gradient manner, or the content of the aluminum component in the distal aluminum barrier layer 143 and the content of the indium component in the indium well layer 142 vary in a gradient manner. In some implementations, in the electron-blocking layer 14, the content of the aluminum component in the proximal aluminum barrier layer 141, the content of the aluminum component in the distal aluminum barrier layer 143 and the content of the indium component in the indium well layer 142 vary in a gradient manner.

It can be understood that, the gradient manner includes two types: a linear gradient and a stepwise gradient. In some implementations, a layered structure in the electron-blocking layer 14 where a content of component varies in a gradient manner may grow in a linear gradient manner, and may also grow in a stepwise gradient manner. In other implementations, part of layer structures in the electron-blocking layer 14 where a content of component varies in a gradient manner grow in a linear gradient manner, and the other parts of layer structures grow in a stepwise gradient manner.

Figure 4:
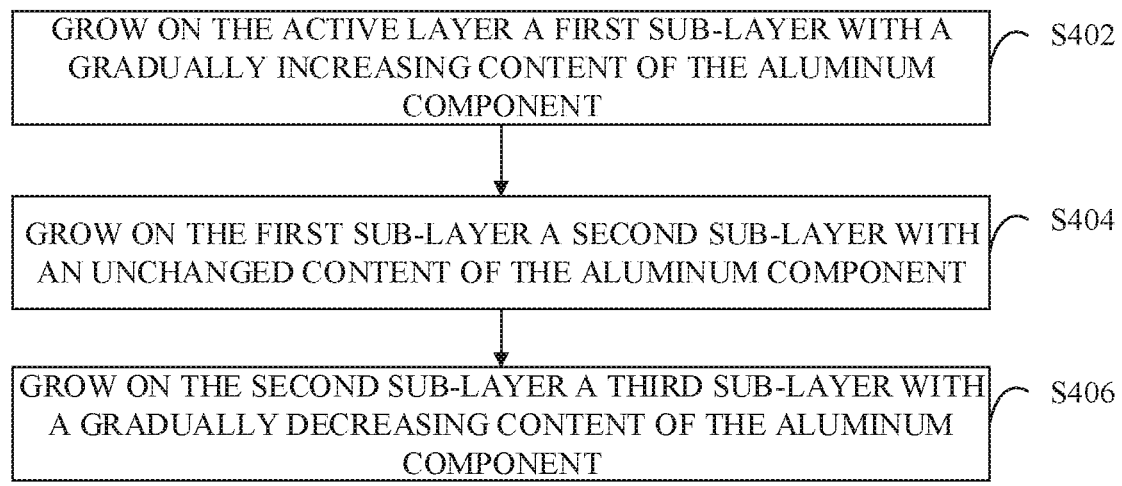
FIG. 4 is a schematic flowchart illustrating growing a proximal aluminum barrier layer provided in an implementation of the present disclosure.

In some implementations, the content of the aluminum component in the proximal aluminum barrier layer 141 varies in the gradient manner. For example, in order to avoid lattice mismatch between the proximal aluminum barrier layer 141 and the active layer 12 and lattice mismatch between the proximal aluminum barrier layer 141 and the indium well layer 142, from one side of the proximal aluminum barrier layer 141 close to the active layer 12 to one side of the proximal aluminum barrier layer 141 away from the active layer, the content of the aluminum component in the proximal aluminum barrier layer 141 gradually increases first, and then gradually decreases. In some examples, the content of the aluminum component in the proximal aluminum barrier layer 141 gradually increases to a peak value, and then immediately decreases gradually. However, in other examples, the content of the aluminum component in the proximal aluminum barrier layer 141 gradually increases to the peak value, is maintained at the peak value in a middle layered structure, and then gradually decreases. In some implementations, the proximal aluminum barrier layer 141 includes a first sub-layer 1411, a second sub-layer 1412, and a third sub-layer 1413. The process of growing the proximal aluminum barrier layer 141 will be described below with reference to FIG. 4, FIG. 5, and FIG. 6.

S402, grow on the active layer a first sub-layer with a gradually increasing content of the aluminum component.

Figure 5:
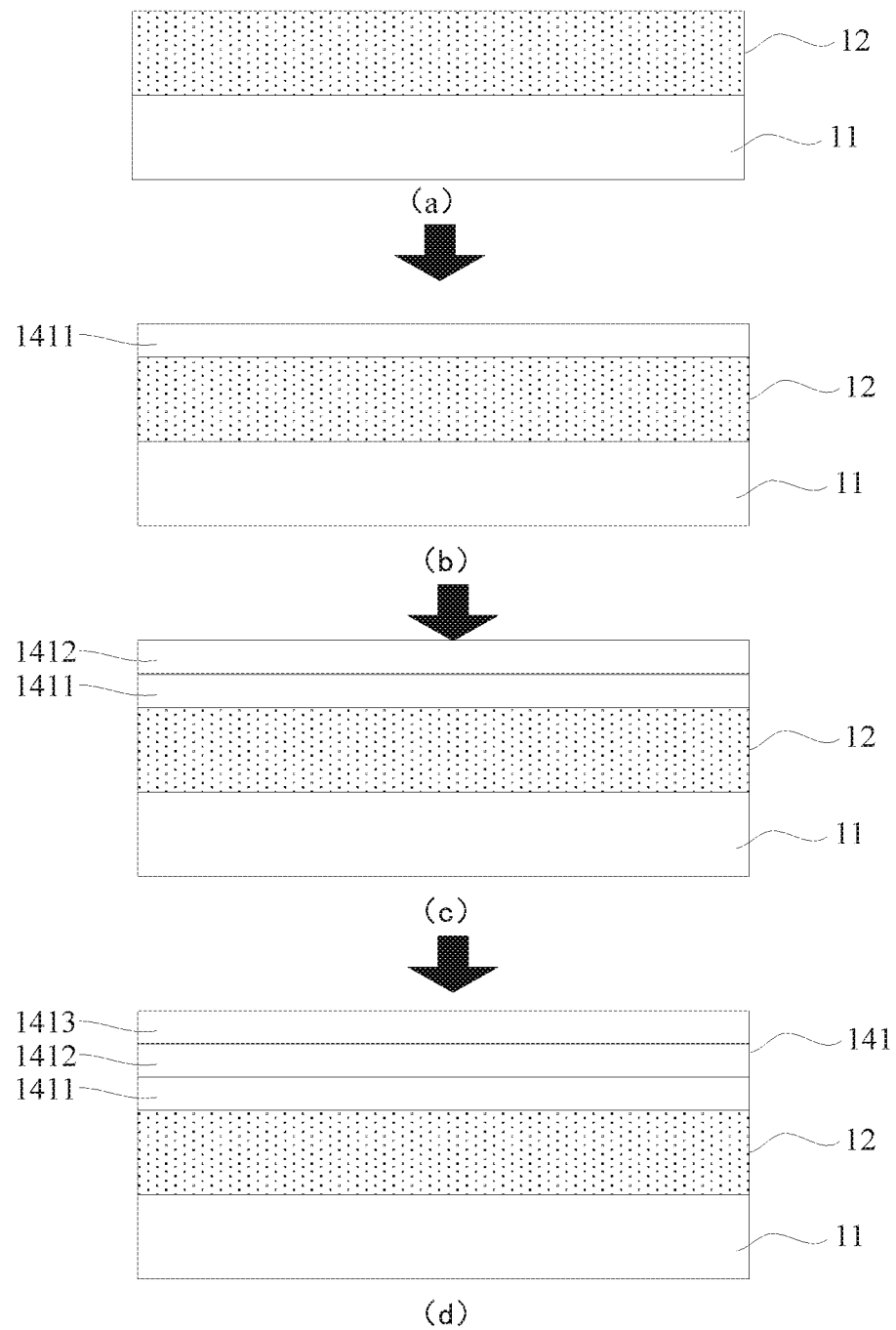
FIG. 5 is a schematic diagram illustrating a process for growing a proximal aluminum barrier layer provided in an implementation of the present disclosure.
Figure 6:
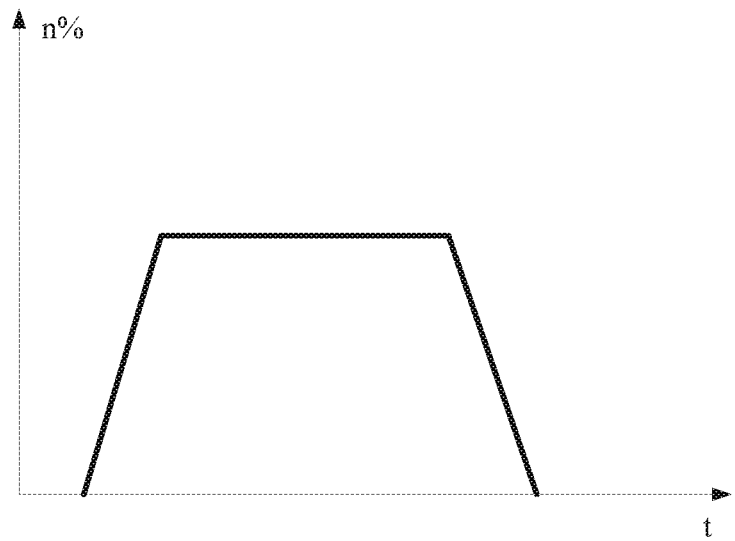
FIG. 6 is a schematic diagram illustrating a variation of a content of aluminum component during growth of a proximal aluminum barrier layer provided in an implementation of the present disclosure.
Figure 7:
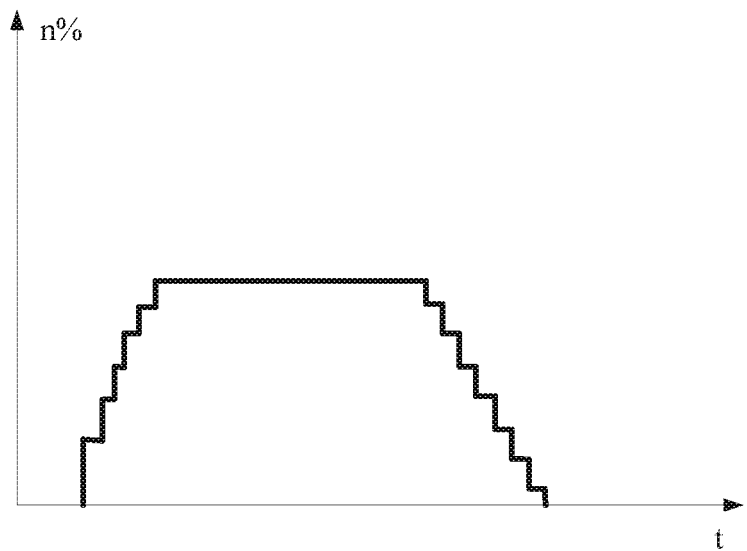
FIG. 7 is a schematic diagram illustrating a variation of a content of aluminum component during growth of a proximal aluminum barrier layer provided in another implementation of the present disclosure.

As illustrated in part (a) of FIG. 5, growth of the N-type semiconductor layer 11 and the active layer 12 in the epitaxial layer 10 is completed. As illustrated in part (b) of FIG. 5, the first sub-layer 1411 is grown on the active layer 12. Reference can be made to FIG. 6, which is a schematic diagram illustrating a variation of a content of aluminum component during growth of a proximal aluminum barrier layer 141. In FIG. 6, the horizontal axis represents time (t), and the vertical axis represents the percentage (n %) of a content of component. As can be seen from FIG. 6, variation of the content of the aluminum component has three stages: a gradually increasing stage, a maintaining stage, and a gradually decreasing stage. The first sub-layer 1411 corresponds to the gradually increasing stage, and the content of the aluminum component gradually increases when the first sub-layer 1411 is grown. It can be understood that, the content of the aluminum component increases and decreases linearly in FIG. 6, however in other implementations, the content of the aluminum component may increase and decrease in a stepwise gradient manner as illustrated in FIG. 7, which is a schematic diagram illustrating another variation of a content of aluminum component during growth of the proximal aluminum barrier layer 141.

In some examples, the content of the aluminum component in the first sub-layer 1411 gradually increases from 0 to for example 6%~12%. For example, the peak value of the content of the aluminum component in the first sub-layer 1411 may be any one of, but not limited to, 6%, 7%, 9%, 10%, 10.5%, or 12%.

S404, grow on the first sub-layer a second sub-layer with an unchanged content of the aluminum component.

As illustrated in part (c) of FIG. 5, after the first sub-layer 1411 is grown, the second sub-layer 1412 is grown on the first sub-layer 1411, and in the second sub-layer 1412, the content of the aluminum component is maintained at the peak value of the content of the aluminum component in the first sub-layer 1411. The second sub-layer 1412 corresponds to a second stage in FIG. 6, i.e., a stage in which the content of the aluminum component is maintained unchanged.

S406, grow on the second sub-layer a third sub-layer with a gradually decreasing content of the aluminum component.

After the second sub-layer 1412 is grown, a third sub-layer 1413 is grown on the second sub-layer 1412, as illustrated in part (d) of FIG. 5. The third sub-layer 1413 corresponds to a third stage in FIG. 6. When the third sub-layer 1413 is grown, the content of the aluminum component gradually decreases. Therefore, the content of the aluminum component gradually decreases from one side of the third sub-layer 1413 close to the active layer 12 to one side of the third sub-layer 1413 away from the active layer 12.

Figure 8:
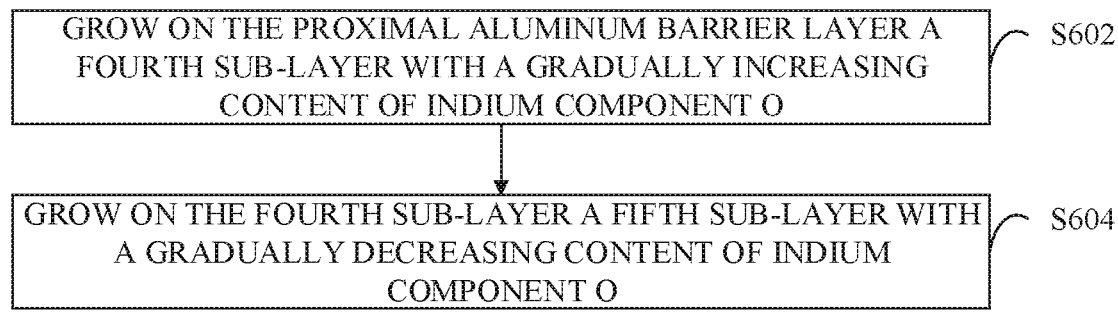
FIG. 8 is a schematic flowchart illustrating growing an indium well layer provided in an implementation of the present disclosure.

In some implementations, a content of indium component in the indium well layer 142 varies in a gradient manner. For example, in order to avoid lattice mismatch between the indium well layer 142 and the proximal aluminum barrier layer 141 and lattice mismatch between the indium well layer 142 and the distal aluminum barrier layer 143, the content of the indium component in the indium well layer 142 gradually increases first and then gradually decreases from the side of the indium well layer 142 close to the active layer 12 to one side of the indium well layer 142 away from the active layer 12. In some implementations, the indium well layer 142 includes a fourth sub-layer 1421 and a fifth sub-layer 1422. The process of growing the indium well layer 142 will be described below with reference to FIG. 8, FIG. 9, and FIG. 10:

S602, grow on the proximal aluminum barrier layer a fourth sub-layer with a gradually increasing content of indium component.

Figure 9:
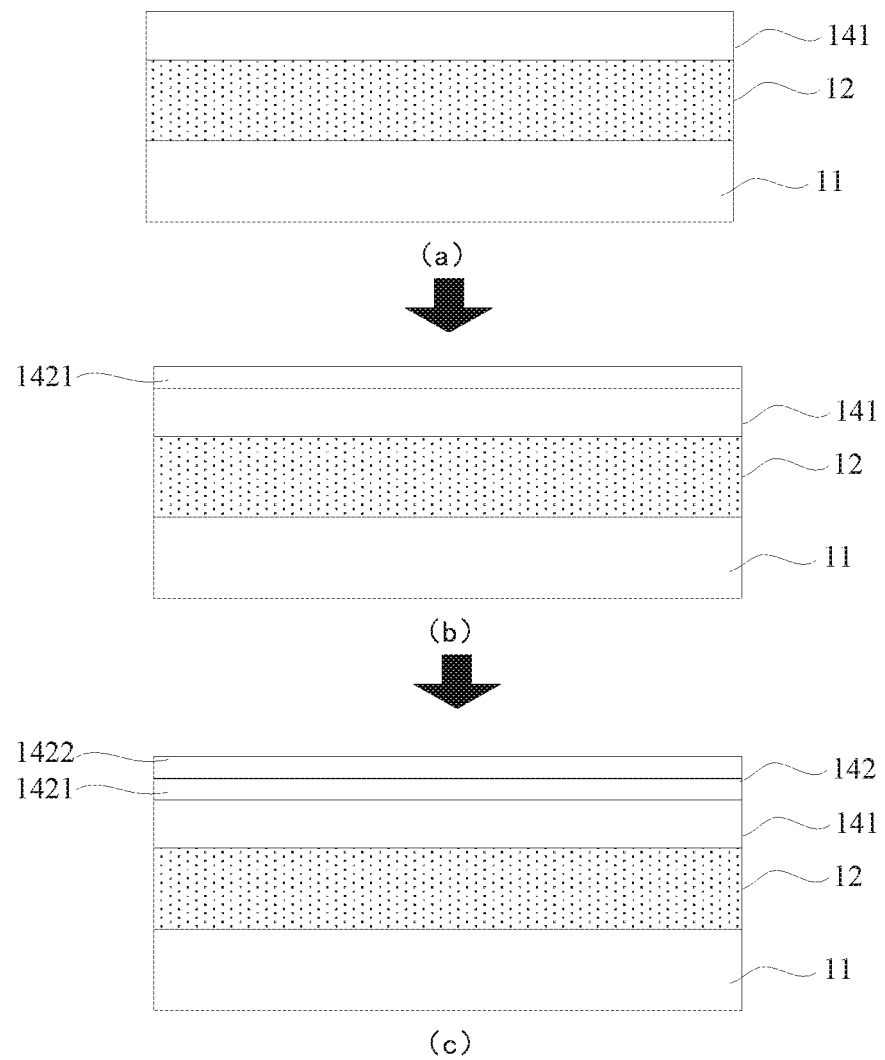
FIG. 9 is a schematic diagram illustrating a process for growing an indium well layer provided in an implementation of the present disclosure.
Figure 10:
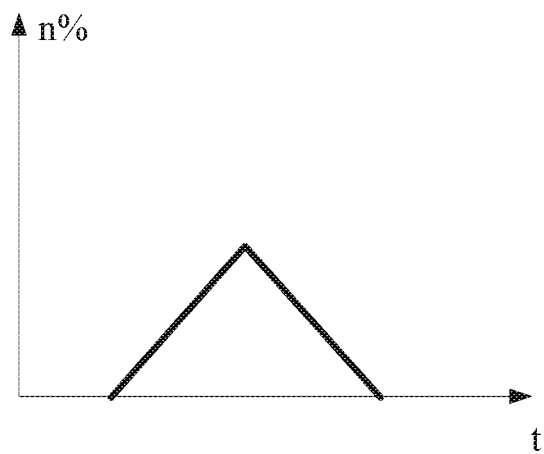
FIG. 10 is a schematic diagram illustrating a variation of a content of indium component during growth of an indium well layer provided in an implementation of the present disclosure.

As illustrated in part (a) of FIG. 9, prior to growth of the fourth sub-layer 1421, the proximal aluminum barrier layer 141 has been grown, thus as illustrated in part (b) of FIG. 9 the fourth sub-layer 1421 is grown on the proximal aluminum barrier layer 141. Reference can be made FIG. 10, which is a schematic diagram illustrating a variation of a content of indium component during growth of an indium well layer 142. As can be seen from FIG. 10, the variation of the content of the indium component in FIG. 10 has two stages: a gradually increasing stage and a gradually decreasing stage. The fourth sub-layer 1421 corresponds to the gradually increasing stage, and the content of the indium component gradually increases when the fourth sub-layer 1421 is grown. It can be understood that the content of the indium component in FIG. 10 increases and decreases linearly, however in other implementations, the content of the indium component in FIG. 10 may increase and decrease in a stepwise gradient manner.

In some implementations, the content of indium component in the fourth sub-layer 1421 gradually increases from 0 to, for example, 2%~6%. For example, the peak value of the content of indium component in the fourth sub-layer 1421 may be any one of 2%, 2.5%, 3%, 3.5%, 4%, 4.5%, 5%, or 6%, but is not limited herein.

S604, grow on the fourth sub-layer a fifth sub-layer with a gradually decreasing content of indium component.

After the fourth sub-layer 1421 is grown, a fifth sub-layer 1422 is grown on the fourth sub-layer 1421, as illustrated in part (c) of FIG. 9. The fifth sub-layer 1422 corresponds to a second stage in FIG. 10. When the fifth sub-layer 1422 is grown, the content of indium component gradually decreases. Therefore, in the fifth sub-layer 1422, the content of indium component gradually decreases from one side of the fifth sub-layer 1422 close to the active layer 12 to one side of the fifth sub-layer 1422 away from the active layer 12.

It should be understood that, although the growth of the indium well layer 142 in FIG. 6 is divided into only two main stages, in other implementations, the growth of the indium well layer 142 may also be divided into more stages, for example, a maintaining stage in which the content of the indium component is maintained at a peak may also be inserted between the gradually increasing stage and the gradually decreasing stage. Optionally, the growth of the indium well layer 142 has a gradually increasing stage, a maintaining stage, a gradually increasing stage, a gradually decreasing stage, a maintaining stage, a gradually decreasing stage, and the like in sequence.

Figure 11:
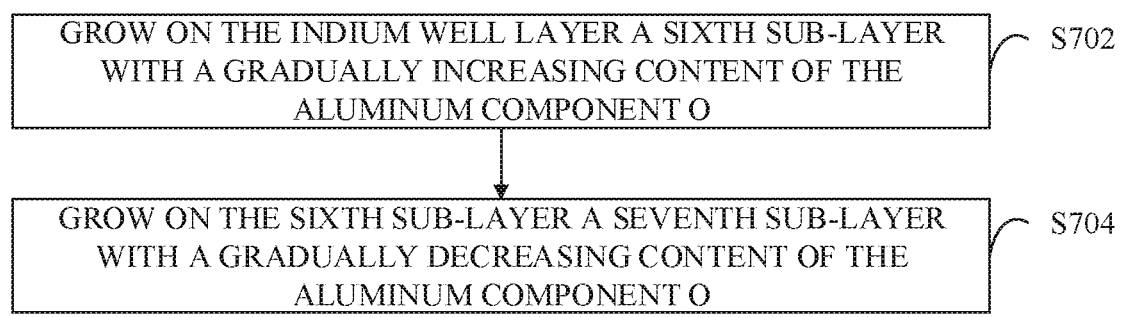
FIG. 11 is a schematic flowchart illustrating growing a distal aluminum barrier layer provided in an implementation of the present disclosure.

In some implementations, the content of the aluminum component in the distal aluminum barrier layer 143 varies in a gradient manner, for example, in order to avoid lattice mismatch between the distal aluminum barrier layer 143 and the indium well layer 142, the content of the aluminum component in the distal aluminum barrier layer 143 gradually increases first and then gradually decreases from one side of the distal aluminum barrier layer 143 close to the active layer 12 to one side of the distal aluminum barrier layer 143 away from the active layer 12. In some examples, the distal aluminum barrier layer 143 includes a sixth sub-layer 1431 and a seventh sub-layer 1432. The process of growing the distal aluminum barrier layer 143 will be described below with reference to FIGS. 11, 12, and 13.

S702, grow on the indium well layer a sixth sub-layer with a gradually increasing content of the aluminum component.

Figure 12:
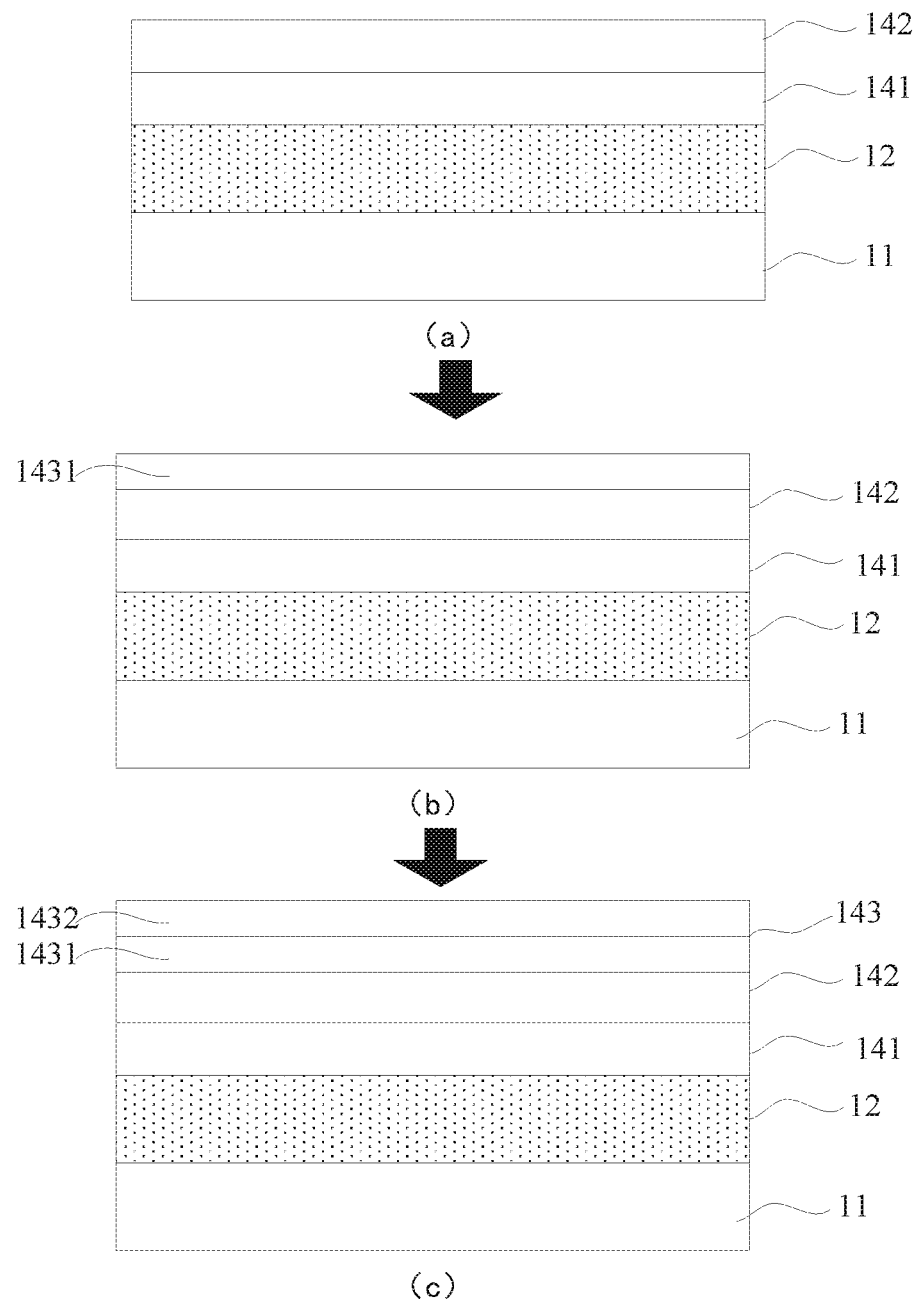
FIG. 12 is a schematic diagram illustrating a process for growing a distal aluminum barrier layer provided in an implementation of the present disclosure.
Figure 13:
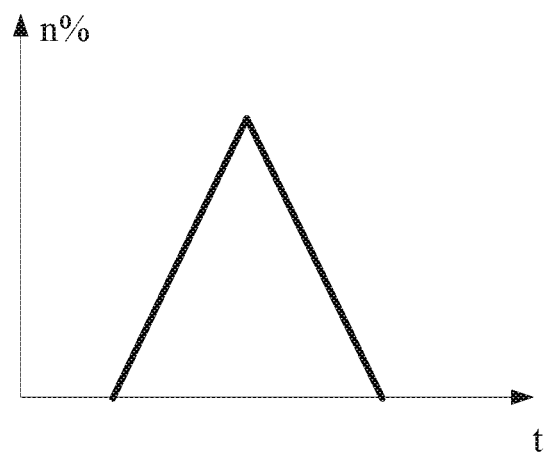
FIG. 13 is a schematic diagram illustrating a variation of a content of aluminum component during growth of a distal aluminum barrier layer provided in an implementation of the present disclosure.

In part (a) of FIG. 12, the indium well layer 142 is grown. A sixth sub-layer 1431 is grown on the indium well layer 142, as illustrated in part (b) of FIG. 12. Reference can be made to FIG. 13 which is a schematic diagram illustrating a variation of a content of aluminum component during growth of a distal aluminum barrier layer 143. As illustrated in FIG. 13, the variation of the content of the aluminum component has two stages: a gradually increasing stage and a gradually decreasing stage. The sixth sub-layer 1431 corresponds to a gradually increasing stage, and therefore, when the sixth sub-layer 1431 is grown, the content of the aluminum component gradually increases. It should be understood that, although the content of the aluminum component increases and decreases linearly in FIG. 13, in other implementations, the content of the aluminum component may increase and decrease in a stepwise gradient manner.

In some implementations, the content of the aluminum component in the sixth sub-layer 1431 gradually increases from 0 to, for example, to 4%~8%. For example, the peak value of the content of the aluminum component in the sixth sub-layer 1431 may be any one of, but not limited to, 4%, 5%, 5.5%, 6%, 6.5%, 7%, or 8%.

S704, grow on the sixth sub-layer a seventh sub-layer with a gradually decreasing content of the aluminum component.

After the sixth sub-layer 1431 is grown, a seventh sub-layer 1432 is grown on the sixth sub-layer 1431 as illustrated in part (c) of FIG. 12. The seventh sub-layer 1432 corresponds to a second stage in FIG. 13, When the seventh sub-layer 1432 is grown, the content of the aluminum component gradually decreases, and therefore, in the seventh sub-layer 1432, from one side of the seventh sub-layer 1432 close to the active layer 12 to one side of the seventh sub-layer 1432 away from the active layer 12, the content of the aluminum component gradually decreases.

Figure 14:
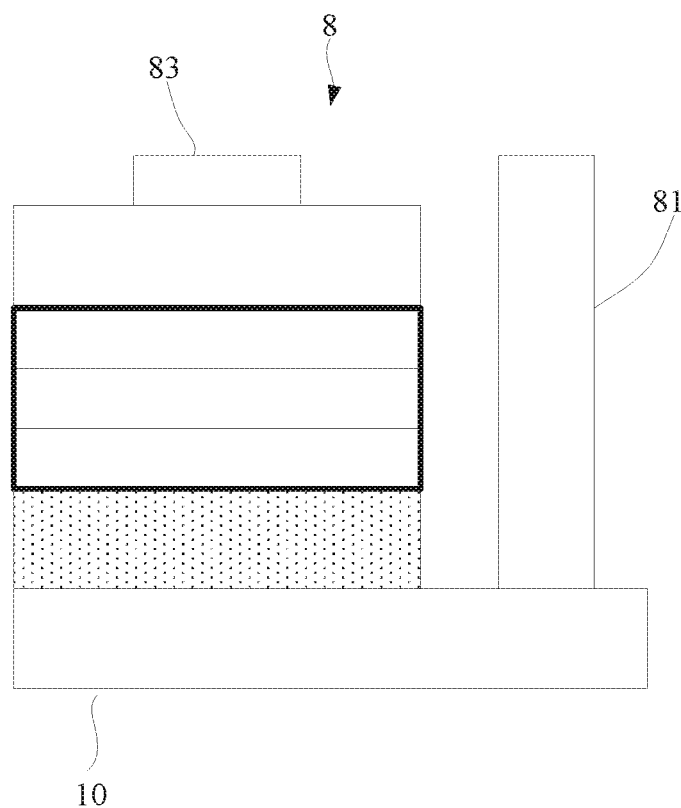
FIG. 14 is a schematic structural diagram of an LED chip provided in an implementation of the present disclosure.

An LED chip is further provided in the present disclosure. Reference can be made to FIG. 14 which is a schematic structural diagram of an LED chip. The LED chip 8 includes an epitaxial layer 10 provided in any one of foregoing examples. In addition, the LED chip 8 further includes an electrode, and the electrode specifically includes an N-electrode 81 electrically coupled with an N-type semiconductor layer 11 in the epitaxial layer 10 and a P-electrode 83 electrically coupled with a P-type semiconductor layer 13. The specific structure of the epitaxial layer 10 have been described in detail above, and will not be repeated herein. It should be understood that, although two chip-electrodes of the LED chip 8 are located on the same side of the epitaxial layer 10 and have a flip-chip structure in FIG. 14, in other implementations, other structures may also be prepared based on the epitaxial layer 10, for example, an LED chip with a normal-chip structure or an LED chip with a vertical structure.

In the epitaxial layer, the LED chip and the method for growing an electron-blocking layer provided in implementations, when an electron-blocking layer for blocking electrons from entering a P-type semiconductor layer is prepared, a pumping structure of a barrier layer/well layer/barrier layer can be formed, and holes in the P-type semiconductor layer are injected into an active layer through the pumping structure, thereby improving injection rate of carriers in the active layer, increasing a probability of recombination of electrons and holes, and improving luminescent efficiency of the active layer. Furthermore, a forward voltage of the LED chip can be reduced because a potential barrier of the distal aluminum barrier layer in the electron-blocking layer that is away from the active layer is lower than the potential barrier of the proximal aluminum barrier layer that is closer to the active layer. Furthermore, since the proximal aluminum barrier layer, the indium well layer, and the distal aluminum barrier layer in the electron-blocking layer can all grow in a component-gradient manner, lattice mismatch in the epitaxial layer can be avoided, a defect density of crystal in the epitaxial layer can be reduced, crystal quality can be improved, and therefore the light-emitting efficiency of the LED chip prepared based on the epitaxial layer can be increased.

Another alternative implementation is provided in the present disclosure.

Figure 15:
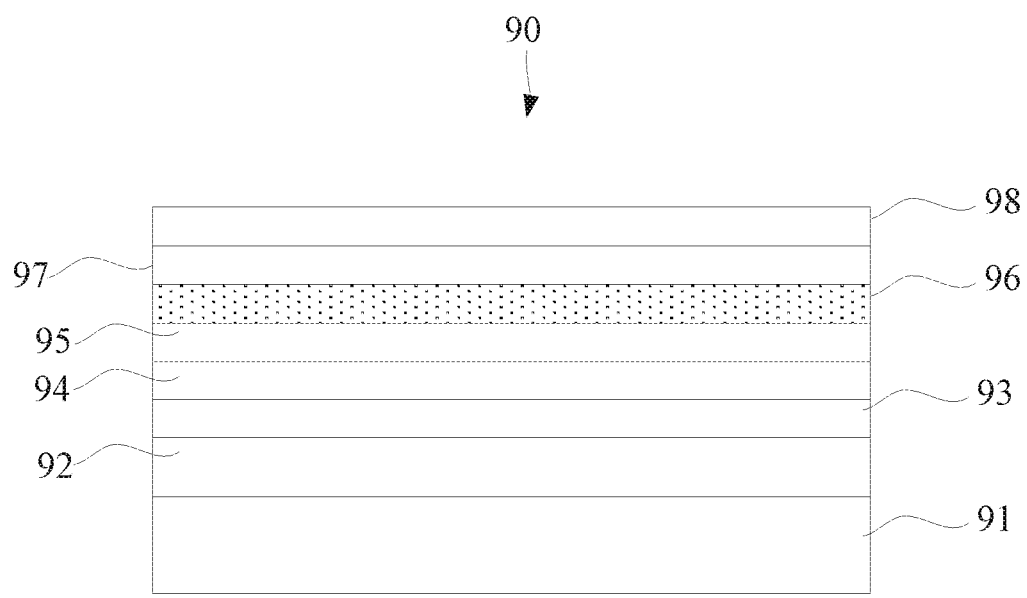
FIG. 15 is a schematic structural diagram of an epitaxial layer provided in another implementation of the present disclosure.

In order to make advantages and details of the method for growing an electron-blocking layer, the epitaxial layer, and the LED chip provided in foregoing examples clearer to those skilled in the art, the foregoing solutions will be further described in this implementation in conjunction with examples, and reference can be made to FIG. 15 which is a schematic structural diagram of an epitaxial layer 90.

Figure 16:
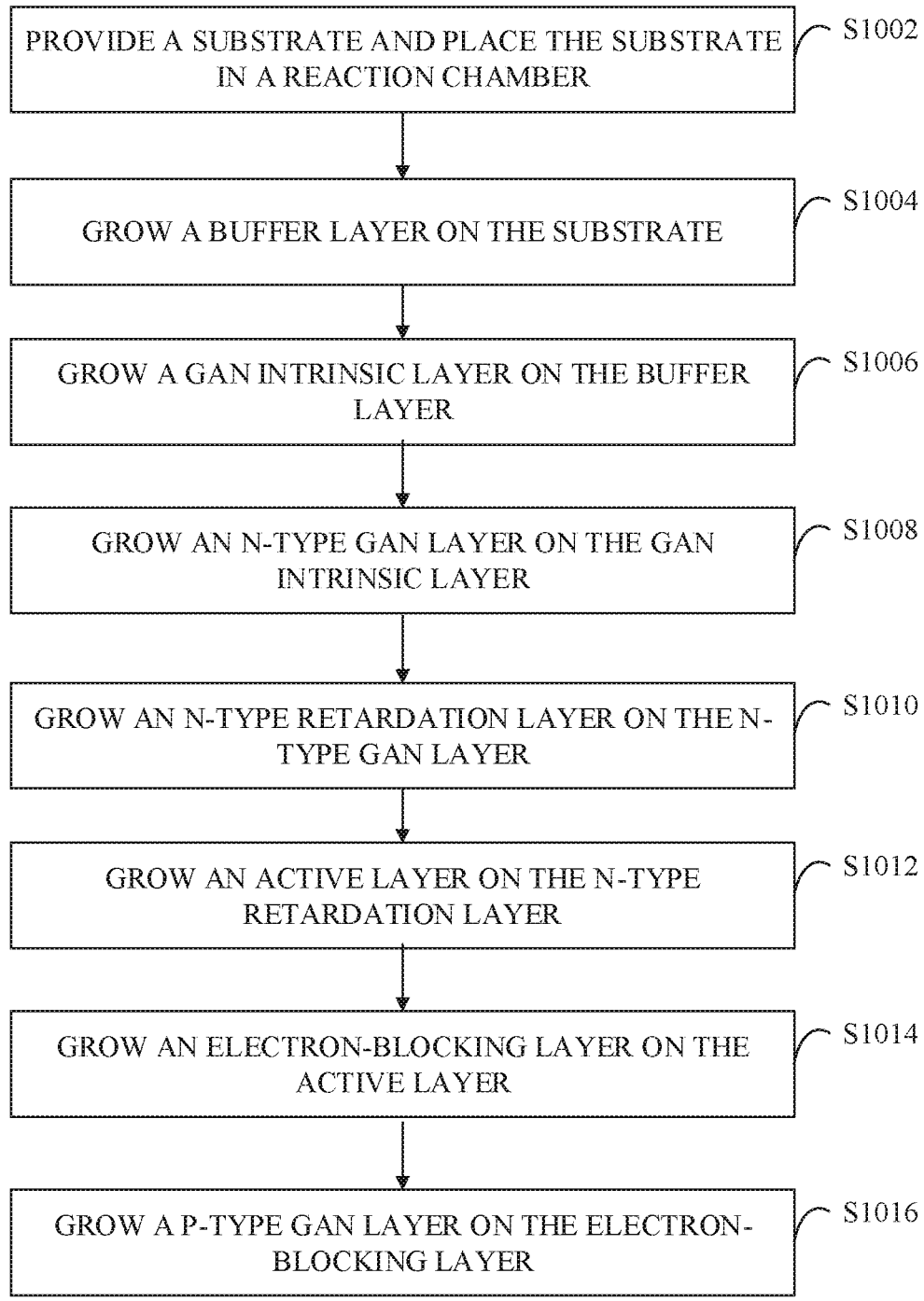
FIG. 16 is a schematic flowchart illustrating growing an epitaxial layer provided in another implementation of the present disclosure.

The epitaxial layer 90 includes a substrate 91, a buffer layer 92 (or nucleation layer), a GaN intrinsic layer 93, an N-type GaN layer 94, an N-type retardation layer 95, an active layer 96, an electron-blocking layer 97 and a P-type GaN layer 98 in sequence. In addition, in some implementations, a stress relief layer (SRL) may be further disposed between the N-type retardation layer 95 and the active layer 96. It should be understood that, when the epitaxial layer 90 is grown, the foregoing layered structures are grown on the substrate 91 according to a sequence of the foregoing layered structures. A growth process of the epitaxial layer 90 will be described below with reference to FIG. 16 is a schematic flowchart illustrating growing the epitaxial layer 90 and FIG. 17 is a schematic diagram illustrating a process for growing the epitaxial layer 90.

S1002, provide a substrate and place the substrate in a reaction chamber.

Figure 17:
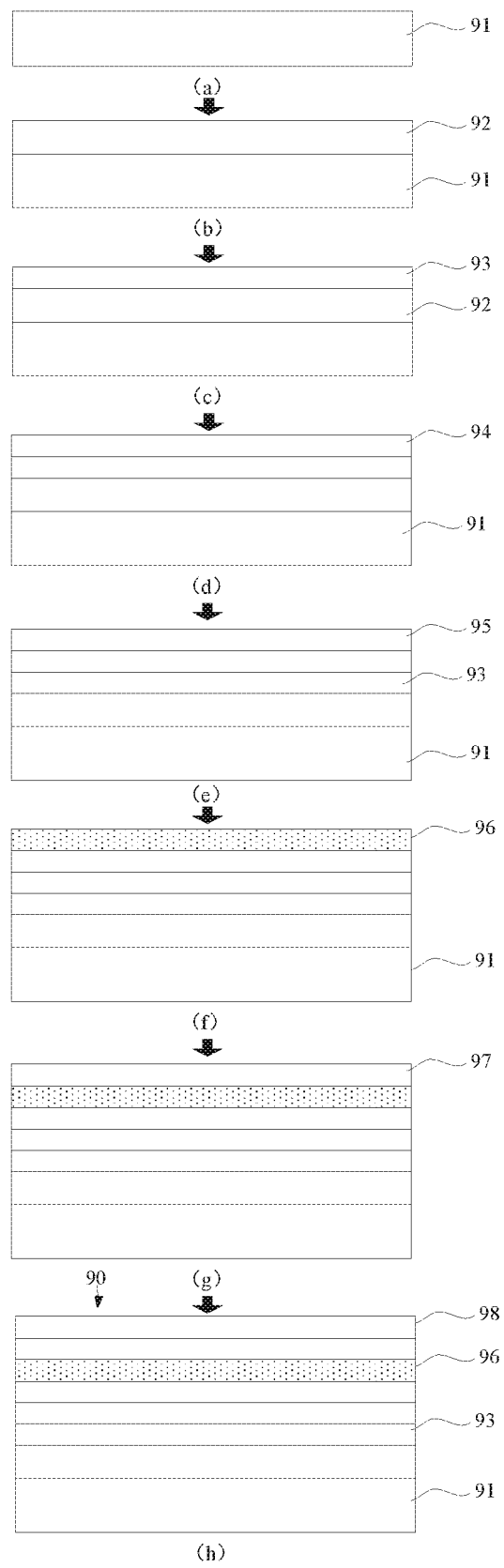
FIG. 17 is a schematic diagram illustrating a process for growing an epitaxial layer provided in another implementation of the present disclosure.

As illustrated in part (a) of FIG. 17, in this implementation, the substrate 91 may include but is not limited to any one of a sapphire substrate, a silicon substrate, and a GaN substrate, and the sapphire substrate 91 is taken as an example herein. It should be understood that, when epitaxial growth is performed by using the substrate 91, preparation work may be performed before formal growth, for example, preheating, cleaning, and the like are performed on the substrate. For example, the sapphire substrate may be baked at a temperature of 1100° C. and the surface of the substrate 91 is cleaned.

In this implementation, the epitaxial layer 90 is grown by a metal-organic chemical vapor deposition (MOCVD) technology, and therefore, the reaction chamber may be an MOCVD reaction chamber. Metal organic sources may include trimethylgallium (TMGa), triethylgallium (TEGa), trimethylindium (TMIn), trimethylaluminum (TMAl). Ammonia (NH3) is used to provide an N source required for growth, silane (SiH4) is used to provide a Si source or germane (GeH4) is used to provide a Ge source in N-type doping; magnetocene (CP2Mg) is used to provide a magnesium source in P-type doping; and at least one of Nitrogen (N2) and hydrogen (H2) can be used as a carrier gas for transmitting an organic source.

S1004, grow a buffer layer on the substrate.

After the substrate 91 is processed, the temperature of the reaction chamber can be reduced to 540° C.~660° C., and a buffer layer 92 with a thickness of 15 nm is grown, as illustrated in part (b) of FIG. 17, where a growth pressure is 100 mbar~400 mbar.

S1006, grow a GaN intrinsic layer on the buffer layer.

After the buffer layer 92 is grown, a GaN intrinsic layer 93 that is an undoped GaN layer is grown, as illustrated in part (c) of FIG. 17. Alternatively, after the buffer layer 92 is grown, the temperature of the reaction chamber may be increased to 950~1050° C., such that a GaN intrinsic layer 93 with a thickness of 1 um~3 um is grown, where a growth pressure is 100 mbar~400 mbar.

S1008, grow an N-type GaN layer on the GaN intrinsic layer.

An N-type GaN layer 94 with a thickness of 1.3 um is grown at a temperature of 1050° C.~1150° C. and a pressure of 300 mbar~600 mbar, as illustrated in part (d) of FIG. 17.

S1010, grow an N-type retardation layer on the N-type GaN layer.

After the N-type GaN layer 94 is grown, an N-type retardation layer 95 is epitaxially grown, as illustrated in part (e) of FIG. 17, where a growth temperature of the N-type retardation layer 95 is about 1050° C.~1150° C., and a growth pressure is about 100 mbar~400 mbar.

S1012, grow an active layer on the N-type retardation layer.

After the N-type retardation layer 95 is grown, the active layer 96 continues to be grown, as illustrated in part (f) of FIG. 17. In the active layer 96, a barrier layer and a well layer alternately grow for 5~15 receptions. The barrier layer is grown under an N2 atmosphere, at a temperature of 800° C.~900° C. and a pressure of 300 mbar~600 mbar, and with a thickness of about 8~15 nm; and the well layer is grown under a N2 atmosphere, at a temperature of 650° C.~750° C. and a pressure of 300 mbar~600 mbar with a thickness of 2 nm~6 nm.

S1014, grow an electron-blocking layer on the active layer.

Figure 18:
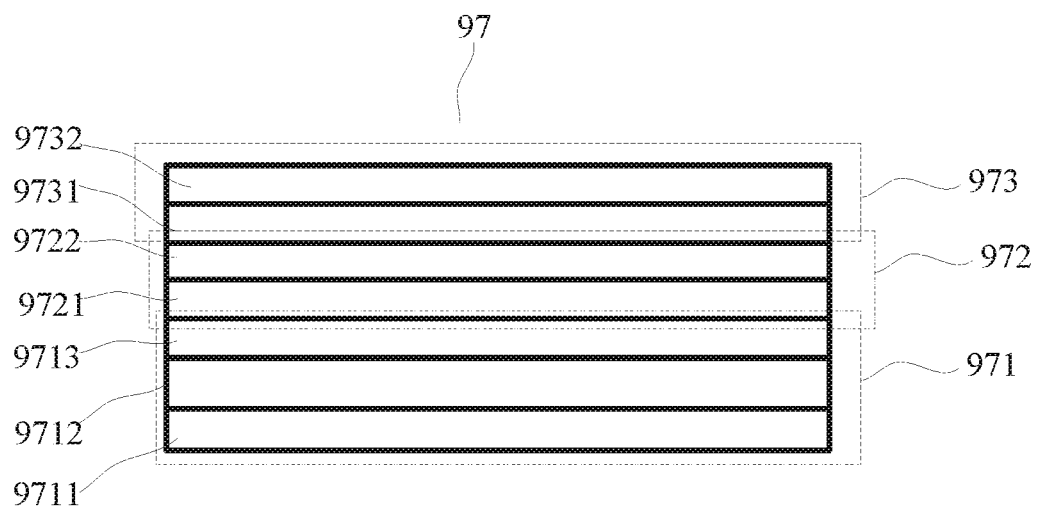
FIG. 18 is a schematic structural diagram of an electron-blocking layer provided in another implementation of the present disclosure.

After the active layer 96 is grown, the temperature of the reaction chamber is increased to be 950° C.~1050° C., and the pressure is maintained at 100 mbar~300 mbar, such that an electron-blocking layer 97 is grown on the active layer 96, where the electron-blocking layer 97 has a growth thickness of 30 nm~50 nm, as illustrated in part (g) of FIG. 17. In this implementation, growth of the electron-blocking layer 97 has three stages, which are growth of a proximal aluminum barrier layer, growth of an indium well layer, and growth of a distal aluminum barrier layer, respectively, as illustrated in FIG. 18. The proximal aluminum barrier layer is a proximal AlGaN layer 971, the indium well layer is an InGaN layer 972, and the distal aluminum barrier layer is a distal AlGaN layer 973.

Figure 19:
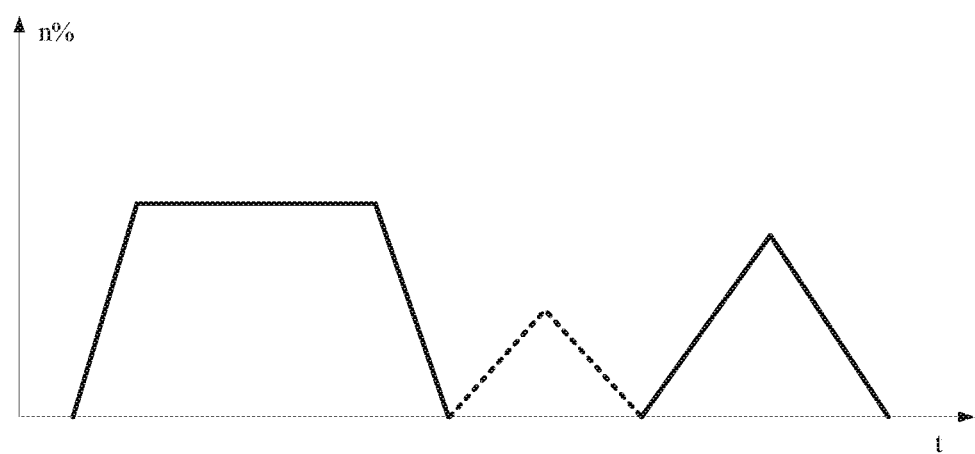
FIG. 19 is a schematic diagram illustrating a variation of a content of aluminum component and nitrogen component during growth of an electron-blocking layer provided in another implementation of the present disclosure.

Growth processes of three layers of the proximal AlGaN layer 971, the InGaN layer 972, and the distal AlGaN layer 973 will be further described with reference to FIG. 19. In FIG. 19, the horizontal axis represents time (t), the vertical axis represents a percentage of a content of component (n %), a solid line represents a content of Al component, and a dotted line represents a content of In component.

First, the content of Al content gradually increases from 0 to 6%~12%, and in the process of the content of Al component gradually increasing, the first sub-layer 9711 with a gradually increasing content of Al component is grown on the active layer 96. The first sub-layer 9711 mainly contains AlGaN, however it can be understood that when the content of the Al component is 0, GaN is grown. Therefore, the first sub-layer 9711 contains GaN and AlGaN with an increasing content of the Al component, so that lattice mismatch with a layered structure grown previously (namely, the active layer) can be avoided while the potential barrier is increased. The first sub-layer 9711 has a thickness ranging from 5 nm to 10 nm. Then, the second sub-layer 9712 is grown by maintaining the content of the Al component at the highest content for a period of time. The second sub-layer 9712 has a thickness ranging from 3 nm to 6 nm. In the proximal AlGaN layer 971, after the content of the Al component reaches the peak, the proximal AlGaN layer 971 will be grown for a period of time by maintaining the content of the Al component at the peak, so that the potential barrier may be increased, thereby increasing an electron-blocking capability. Subsequently, the content of the Al component gradually decreases from the peak value to 0, and a third sub-layer 9713 is grown in the process of the content of the Al component gradually decreasing. The third sub-layer 9713 has a thickness ranging from 5 nm to 10 nm. It can be understood that, after the content of the Al component in AlGaN decreases to 0, AlGaN becomes GaN, and therefore the third sub-layer 9713 mainly contains AlGaN, and GaN exists on the top of the third sub-layer 9713. It should be understood that, after the third sub-layer 9713 is grown, growth of the proximal AlGaN layer 971 is completed.

Then, the InGaN layer 972 is grown on the proximal AlGaN layer 971. A growth pressure of the InGaN layer 972 ranges from 100 mbar to 300 mbar. First, a content of In component gradually increases from 0 to 2%~6%, a fourth sub-layer 9721 with an increasing content of the In component is grown in the process of the content of the In component gradually increasing, and the fourth sub-layer 9721 has a thickness ranging from 3 nm to 6 nm. It should be understood that, because the proximal AlGaN layer 971 does not contain In component, InGaN with a gradually increasing content of the In component is grown on the proximal AlGaN layer 971, so that lattice mismatch and interface polarization may be avoided, and a crystal defect may be reduced. When the content of the In component is 0, GaN is grown, and then when the content of the In component is greater than 0, InGaN is grown. Therefore, the fourth sub-layer 9721 mainly includes InGaN, but also includes a small amount of GaN. Similarly, when the content of the In component reaches a peak value, the content of the In component may gradually decreases to 0, and a fifth sub-layer 9722 with a thickness ranging from 3 nm to 6 nm is grown in the process of decreasing of the content of the In component. In this way, the crystal quality of subsequent In-free layered structure grown on the fifth sub-layer 9722 can be optimized. After the fifth sub-layer 972 is grown, growth of the InGaN layer 972 is completed, and the InGaN layer 972, serving as a channel layer, improves injection efficiency of holes.

Next, a distal AlGaN layer 973 is grown on the InGaN layer 972. First, also for the purpose of avoiding lattice mismatch, in the process of growing a barrier with an increasing content of the Al component, the content of the Al component gradually increases from 0. In this implementation, the content of the Al component in the distal AlGaN layer 973 is 50%~70% of the content of the Al component in the proximal AlGaN layer 971. For example, the peak value of the content of the Al component in the distal AlGaN layer 973 may be between 4%~8%. A layered structure grown in the process of the content of the Al component gradually increasing is a sixth sub-layer 9731 with a thickness ranging from 5 nm to 10 nm. When the content of Al component reaches the peak value, the content of Al component may gradually decreases to 0, and a 5 μm a seventh sub-layer 9732 with a thickness ranging from 5 nm to 10 nm is grown in the process of content the Al component gradually decreasing. After seventh sublayer 9732 is grown, growth of the distal AlGaN layer 973 is completed, and thus, growth of the electron-blocking layer 97 is completed.

S1016, grow a p-type GaN layer on the electron-blocking layer.

After the electron-blocking layer 97 is grown, the p-type GaN layer 98 is grown with H2 as a carrier gas at a growth temperature of 900° C.~1050° C. and a growth pressure of 300 mbar~600 mbar, and the p-type GaN layer 98 has a thickness ranging from 50 nm~150 nm, as illustrated in part (h) of FIG. 17.

After the p-type GaN layer 98 is grown, a growth process may be completed by annealing under N2 atmosphere and at a temperature of 650° C.~750° C.

It should be noted that, in the above implementations, when the electron-blocking layer 97 is grown, the content of the Al component and the content of the In component vary in a linear gradient manner, but in other implementations, at least one of the content of the Al component and the content of the In component may vary in a stepwise gradient manner.

An LED chip is further provided in the present disclosure. The LED chip includes an epitaxial layer 90, and an N-electrode, and a P-electrode, where the N-electrode is electrically coupled with an N-type GaN layer 94 in the epitaxial layer 90, and the P-electrode is electrically coupled with a P-type GaN layer 98 in the epitaxial layer 90. In addition, a display panel is further provided in the present disclosure. The display panel includes a drive back plate and multiple LED chips, where chip-electrodes of the LED chips are electrically coupled with a drive circuit on the drive back plate, and at least some of the multiple LED chips are prepared based on the epitaxial layer 90.

In the epitaxial layer provided in implementations, growth of the electron-blocking layer is divided into three stages. In a first stage of growth, the content of Al component is controlled to gradually increase, so as to avoiding lattice mismatch with a previous active layer. when the content of the Al component is the highest, continue to grow the electron-blocking layer while maintaining the content of the Al component unchanged, so as to increase a potential barrier and increase an electron-blocking capability. Subsequently, the content of the Al component gradually decreases, such that a first stage of growth is completed. In a second stage of growth, the content of the In component is controlled to gradually increase first and then gradually decrease, such that a channel layer is formed. In a third stage of growth, the content of the Al component is controlled to gradually increase and then gradually decrease. Epitaxial growth with a content of component gradually varying can avoid interface polarization and lattice mismatch, improve crystal quality of material growth, and reduce a potential-barrier voltage. Furthermore, the channel layer is formed to enhance injection efficiency of holes, effectively increase a probability of efficient light-emitting recombination of the electrons and the holes in the active layer, and improve luminescent efficiency. A structure grown though three stages forms with a higher potential-barrier layer/well layer/lower potential-barrier layer, which is also beneficial for forming a hole-injection pumping structure, thereby improving hole injection efficiency of the active layer.

In the described epitaxial layer, the LED chip, and the method for growing an electron-blocking layer, an electron-blocking layer is disposed on an active layer, the electron-blocking layer is used to block electrons in the active layer from escaping to a P-type semiconductor layer, thereby improving recombination efficiency of electrons and holes in the active layer, and being beneficial to increasing internal quantum efficiency of the LED chip. Meanwhile, since a hole pumping structure is formed in an electron-blocking layer through a proximal aluminum barrier layer, an indium well layer, and a distal aluminum barrier layer, and the indium well layer serves as a channel layer, injection efficiency of holes into the active layer can be improved, a probability of efficient light-emitting recombination of the electrons and the holes in the active layer is effectively increased, and luminescent efficiency of the LED chip is improved. In addition, since a content of aluminum component in the distal aluminum barrier layer is lower than a content of aluminum component in the proximal aluminum barrier layer, a potential barrier of the distal aluminum barrier layer is lower than a potential barrier of the proximal aluminum barrier layer, which helps to reduce a forward voltage of a device.

It should be understood that the application of the present disclosure is not limited to the above implementations, and those skilled in the art can make improvements or modifications according to above descriptions, and all these improvements and modifications shall belong to the scope of protection of the appended claims of the present disclosure.

What is claimed is:
1. An epitaxial layer, comprising:
an N-type semiconductor layer;
an active layer;
a P-type semiconductor layer; and
an electron-blocking layer, wherein
the electron-blocking layer is disposed between the active layer and the P-type semiconductor layer, and the N-type semiconductor layer is disposed on one side of the active layer away from the electron-blocking layer;
the electron-blocking layer comprising:
a proximal aluminum barrier layer close to the active layer;
a distal aluminum barrier layer close to the P-type semiconductor layer, a content of aluminum component in the distal aluminum barrier layer being lower than a content of aluminum component in the proximal aluminum barrier layer; and
an indium well layer disposed between the proximal aluminum barrier layer and the distal aluminum barrier layer;
at least one of the content of the aluminum component in the proximal aluminum barrier layer, the content of the aluminum component in the distal aluminum barrier layer, or a content of indium component in the indium well layer varies in a gradient manner,
the proximal aluminum barrier layer comprises a first sub-layer, a second sub-layer, and a third sub-layer in sequence, and the first sub-layer is closest to the active layer, and
from one side of the proximal aluminum barrier layer close to the active layer to one side of the proximal aluminum barrier layer away from the active layer, a content of the aluminum component in the first sub-layer gradually increases, a content of the aluminum component in the second sub-layer maintains unchanged, a content of the aluminum component in the third sub-layer gradually decreases, and peak values of the content of the aluminum component in the first sub-layer, the content of the aluminum component in the second sub-layer, and the content of the aluminum component in the third sub-layer are the same.

2. The epitaxial layer of claim 1, wherein the proximal aluminum barrier layer and the distal aluminum barrier layer each contain Aluminum Gallium Nitride (AlGaN).

3. The epitaxial layer of claim 1, wherein the indium well layer contains Indium Gallium Nitride (InGaN).

4. The epitaxial layer of claim 1, wherein the content of the aluminum component in the distal aluminum barrier layer is 45% to 75% of the content of the aluminum component in the proximal aluminum barrier layer.

5. The epitaxial layer of claim 1, wherein the gradient manner is a stepwise gradient.

6. The epitaxial layer of claim 1, wherein the gradient manner is a linear gradient.

7. The epitaxial layer of claim 1, wherein
the indium well layer comprises a fourth sub-layer and a fifth sub-layer in sequence, and the fourth sub-layer is closer to the active layer; and
from one side of the indium well close to the active layer to one side of the indium well away from the active layer, a content of indium component in the fourth sub-layer gradually increases, and a content of indium component in the fifth sub-layer gradually decreases.

8. The epitaxial layer of claim 1, wherein
the distal aluminum barrier layer comprises a sixth sub-layer and a seventh sub-layer in sequence, and the sixth sub-layer is closer to the active layer; and
from one side of the distal aluminum barrier close to the active layer to one side of the of the distal aluminum barrier away from the active layer, a content of aluminum component in the sixth sub-layer gradually increases, and a content of aluminum component in the seventh sub-layer gradually decreases.

9. A light-emitting diode (LED) chip, comprising:
an N-type semiconductor layer;
an active layer;
a P-type semiconductor layer;
an electron-blocking layer;
an N-electrode electrically coupled with the N-type semiconductor layer; and
a P-electrode electrically coupled with the P-type semiconductor layer, wherein
the electron-blocking layer is disposed between the active layer and the P-type semiconductor layer, and the N-type semiconductor layer being disposed on one side of the active layer away from the electron-blocking layer; the electron-blocking layer comprising:
a proximal aluminum barrier layer close to the active layer;
a distal aluminum barrier layer close to the P-type semiconductor layer, a content of aluminum component in the distal aluminum barrier layer being lower than a content of aluminum component in the proximal aluminum barrier layer; and
an indium well layer disposed between the proximal aluminum barrier layer and the distal aluminum barrier layer,
at least one of the content of the aluminum component in the proximal aluminum barrier layer, the content of the aluminum component in the distal aluminum barrier layer, or a content of indium component in the indium well layer is in a gradient manner,
the indium well layer comprises a fourth sub-layer and a fifth sub-layer in sequence, and the fourth sub-layer is closer to the active layer, and
from one side of the indium well layer close to the active layer to one side of the indium well layer away from the active layer, indium component in the fourth sub-layer gradually increases, and indium component in the fifth sub-layer gradually decreases.

10. The LED chip of claim 9, wherein the gradient manner is a stepwise gradient.

11. The LED chip of claim 9, wherein
the proximal aluminum barrier layer comprises a first sub-layer, a second sub-layer, and a third sub-layer in sequence, and the first sub-layer is closest to the active layer; and
from one side close of the proximal aluminum barrier layer to the active layer to one side of the proximal aluminum barrier layer away from the active layer, a content of a content of aluminum component in the first sub-layer gradually increases, a content of aluminum component in the second sub-layer maintains unchanged, a content of aluminum component in the third sub-layer gradually decreases, and peak values of the content of the aluminum component in the first sub-layer, the content of the aluminum component in the second sub-layer, and the content of the aluminum component in the third sub-layer are the same.

12. The LED chip of claim 9, wherein
the distal aluminum barrier layer comprises a sixth sub-layer and a seventh sub-layer in sequence, and the sixth sub-layer is closer to the active layer; and
from one side of the distal aluminum barrier layer close to the active layer to one side of the distal aluminum barrier layer away from the active layer, a content of aluminum component in the sixth sub-layer gradually increases, and a content of aluminum component in the seventh sub-layer gradually decreases.

13. A method for growing an electron-blocking layer, comprising:
growing a proximal aluminum barrier layer on a surface of an active layer away from an N-type semiconductor layer;
growing an indium well layer on the proximal aluminum barrier layer; and
growing a distal aluminum barrier layer on the indium well layer, a content of aluminum component in the distal aluminum barrier layer being lower than a content of aluminum component in the proximal aluminum barrier layer,
wherein growing the proximal aluminum barrier layer on the surface of the active layer away from the N-type semiconductor layer comprises:
growing on the active layer a first sub-layer with a gradually increasing content of the aluminum component;
growing on the first sub-layer a second sub-layer with an unchanged content of the aluminum component; and
growing on the second sub-layer a third sub-layer with a gradually decreasing content of the aluminum component.

14. The method of claim 13, wherein growing the indium well layer on the proximal aluminum barrier layer comprises:
growing on the proximal aluminum barrier layer a fourth sub-layer with a gradually increasing content of indium component; and
growing on the fourth sub-layer a fifth sub-layer with a gradually decreasing content of indium component.

15. The method of claim 13, wherein growing the distal aluminum barrier layer on the indium well layer comprises:
growing on the indium well layer a sixth sub-layer with a gradually increasing content of the aluminum component; and
growing on the sixth sub-layer a seventh sub-layer with a gradually decreasing content of the aluminum component.

* * * * *